(12) United States Patent
Seo

(10) Patent No.: US 8,067,969 B2
(45) Date of Patent: Nov. 29, 2011

(54) INTEGRATED CIRCUIT

(75) Inventor: Woo-Hyun Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,774

(22) Filed: Jun. 29, 2009

(65) Prior Publication Data

US 2010/0123500 A1    May 20, 2010

(30) Foreign Application Priority Data

Nov. 17, 2008  (KR) ..................... 10-2008-0113937

(51) Int. Cl.
*H03K 5/12* (2006.01)

(52) U.S. Cl. ......... 327/170; 327/172; 327/36; 327/404

(58) Field of Classification Search .................. 327/170, 327/172–176, 31, 35, 36, 403–404, 415–416
See application file for complete search history.

(56) References Cited

U.S. PATENT DOCUMENTS

| | | | |
|---|---|---|---|
| 6,049,504 A | | 4/2000 | Suh |
| 6,087,887 A | * | 7/2000 | Lim et al. ...................... 327/416 |
| 6,175,938 B1 | | 1/2001 | Hsu |
| 7,129,762 B1 | * | 10/2006 | Vadi ............................. 327/218 |
| 7,509,543 B2 | | 3/2009 | Mohr et al. |
| 2007/0177441 A1 | | 8/2007 | Lee et al. |
| 2009/0006916 A1 | | 1/2009 | Lockwood et al. |
| 2009/0067278 A1 | | 3/2009 | Choi et al. |
| 2009/0096500 A1 | * | 4/2009 | Seo et al. ...................... 327/170 |

FOREIGN PATENT DOCUMENTS

| | | |
|---|---|---|
| JP | 2003-036700 | 2/2003 |
| JP | 2008-299962 | 12/2008 |
| KR | 100292404 | 6/2001 |
| KR | 100862999 | 10/2008 |

OTHER PUBLICATIONS

Notice of Allowance issued from Korean Intellectual Property Office on May 31, 2011.

* cited by examiner

*Primary Examiner* — An Luu
(74) *Attorney, Agent, or Firm* — IP & T Group LLP

(57) ABSTRACT

An integrated circuit includes a pull-up compensation path unit configured to adjust a pull-up driving power of an input signal; a pull-down compensation path unit configured to adjust a pull-down driving power of the input signal; and a path control unit configured to route the input signal to one of the pull-up compensation unit and the pull-down compensation unit in response to a conditional signal.

26 Claims, 4 Drawing Sheets

INTEGRATED CIRCUIT

CROSS-REFERENCE TO RELATED APPLICATIONS

The present application claims priority of Korean patent application No. 10-2008-0113937, filed on Nov. 17, 2008, the disclosure of which is incorporated by reference in its entirety.

BACKGROUND OF THE INVENTION

The present invention relates to a semiconductor design technology, and more particularly, to an integrated circuit for compensating for abnormal pull-up and pull-down operations based on external environment and process variations. The present invention may be applied to circuits using an inverter delay having a large skew variation.

In general, when a circuit having Metal-Oxide Semiconductor (MOS) transistors is designed, a skew may occur in a change of a threshold voltage, an oxide thickness, a gate and an active resistance. However, it is difficult to verify the external environment and process variations.

Simulation conditions including 'FF, FT, FS, TF, TT, TS, SF, ST and SS' are used to test the external environment and process. 'FF' denotes a skew simulation under an NMOS of a fast condition and a PMOS of a fast condition, 'FT' denotes a skew simulation under an NMOS of a fast condition and a PMOS of a typical condition, 'FS' denotes a skew simulation under an NMOS of a fast condition and a PMOS of a slow condition, 'TF' denotes a skew simulation under an NMOS of a typical condition and a PMOS of a fast condition, 'TT' denotes a skew simulation under an NMOS of a typical condition and a PMOS of a typical condition, 'TS' denotes a skew simulation under an NMOS of a typical condition and a PMOS of a slow condition, 'SF' denotes a skew simulation under an NMOS of a slow condition and a PMOS of a fast condition, 'ST' denotes a skew simulation under an NMOS of a slow condition and a PMOS of a typical condition, and 'SS' denotes a skew simulation under an NMOS of a slow condition and a PMOS of a slow condition, FIG. 1 is a circuit diagram illustrating a conventional pulse generator and FIG. 2 is a waveform diagram illustrating abnormal pulse signals. The conventional pulse generator includes a delay unit 10, a NAND gate NA1 and first and second inverters INV1 and INV2. The conventional pulse generator generates an output signal OUT through the delay unit 10, the NAND gate NA1 and inverters INV1 and INV2.

The delay unit 10 delays a first input signal IN1 for a predetermined time and outputs a delayed input signal IN1_DLY. The first inverter INV1 inverts a second input signal IN2 and outputs an inverted input signal IN2B. The NAND gate NA1 performs a logical NAND operation of the delayed input signal IN1_DLY and the inverted input signal IN2B. The second inverter INV2 inverts an output signal of the NAND gate NA1 and generates the output signal OUT.

However, when pull-up and pull-down operations are performed in accordance with simulation conditions described above, abnormal operation may occur in the conventional pulse generator as shown in FIG. 1.

That is, as shown in FIG. 2, if the simulation is performed under the typical condition, the rising and falling edges of an output pulse are outputted to have a normal skew as designated by SIGNAL1. However, if the simulation is performed under a slow condition, first and second abnormal signals SIGNAL2 and SIGNAL3 are generated because of a short timing margin between the inverted input signal IN2B and the delayed input signal IN1_DLY delayed by a change of a threshold voltage, an oxide thickness, a gate and an active resistance of NMOS or PMOS transistors included in the delay unit 10.

The first abnormal signal SIGNAL2 is generated when the pull-up MOS transistor is abnormal and the skew of the rising edge of the pulse is abnormal. The second abnormal signal SIGNAL3 is generated when the pull-down MOS transistor of the delay unit is abnormal and the skew of the falling edge of the pulse is abnormal.

Because it is difficult to predict external environment and process variables for circuit malfunctions caused by the pull-up or pull-down variation, it has a problem that the revision is difficult.

Under identical conditions, the pull-up transistor of the delay unit may perform abnormal operations, and the pull-down transistor may perform normal operations.

Moreover, if the change of the pull-up and pull-down is large, a revision process for compensating the operation of pull-up and pull-down elements should be added. This may cause time and cost waste.

SUMMARY OF THE INVENTION

Embodiments of the present invention are directed to providing an integrated circuit for compensating for abnormal pull-up and pull-down operations based on external environment and process variations.

In accordance with an aspect of the present invention, there is provided an integrated circuit including a pull-up compensation path unit configured to adjust a pull-up driving power of an input signal; a pull-down compensation path unit configured to adjust a pull-down driving power of the input signal; and a path control unit configured to route the input signal to one of the pull-up compensation unit and the pull-down compensation unit in response to a conditional signal.

The pull-up compensation path unit may adjust a rising edge skew of an output pulse, and the pull-down compensation path unit may adjust a falling edge skew of the output pulse.

The pull-up driving power may be determined by the number or size of pull-up transistors included in the pull-up compensation path unit.

The pull-down driving power may be determined by the number or size of pull-down transistors included in the pull-down compensation path unit.

The path control unit may include a control unit configured to generate a control signal in response to the conditional signal, and a selection unit configured to provide the input signal to one of the pull-up compensation path unit and the pull-down compensation path unit in response to the control signal.

The control unit may generate the control signal based on the conditional signal which includes an operation mode and an external power supply.

The conditional signal may include a test signal for performing one of a normal mode and a test mode, and the control unit controls the state of the control signal based on the state of the test signal.

The control unit may include a fuse and the conditional signal may include a fuse cutting state which represents the external power supply.

The selection unit may include a transfer gate for transferring the input signal in response to the control signal.

In accordance with another aspect of the present invention, there is provided an integrated circuit including a path control unit configured to generate a plurality of path control signals;

and a plurality of internal circuits, each configured to have a pull-up compensation path and a pull-down compensation path, and to process a corresponding input signal through one of the pull-up compensation path and the pull-down compensation path in response to a corresponding path control signal.

The path control unit may include a control unit configured to a plurality of control signals based on operation modes and an external power supply, and a decoder configured to decode the plurality of control signals and to output the decoded control signals as the path control signals.

The control unit may include a fuse for controlling the external power supply, and controls the state of the control signals based on the cutting state of the fuse.

The control unit may receive a plurality of test signals for performing one of a normal mode and a test mode, and control the state of the control signals based on the state of the test signals.

Each of the internal circuits may include a pull-up compensation path unit for adjusting a pull-up driving power of the corresponding input signal, a pull-down compensation path unit for adjusting a pull-down driving power of the corresponding input, and a selection unit for selecting one of the pull-up compensation path unit and the pull-down compensation path unit in response to the path control signal, and for providing the corresponding input signal to a selected path.

The pull-up compensation path unit may adjust a rising edge skew of an output pulse, and the pull-down compensation path unit may adjust a falling edge skew of the output pulse.

The pull-up driving power may be determined by the number or size of pull-up transistors included in the pull-up compensation path unit.

The pull-down driving power may be determined by the number or size of pull-down transistors included in the pull-down compensation path unit.

The selection unit may include a transfer gate for transferring the input signal in response to the path control signal.

In accordance with another aspect of the present invention, there is provided an integrated circuit including a pulse generation circuit unit configured to have an inverter chain; and a driving power compensation unit configured to selectively compensate for one of a pull-up driving power and a pull-down driving power of each of inverters included in the inverter chain, wherein the driving power compensation unit includes a pull-up compensation path unit configured to adjust the pull-up driving power of an input signal; a pull-down compensation path unit configured to adjust the pull-down driving power of the input signal; and a path control unit configured to route an input signal to one of the pull-up compensation path unit and the pull-down compensation path unit in response to a conditional signal.

The pull-up driving power may be determined by the number or size of pull-up transistors included in the pull-up compensation path unit.

The pull-down driving power may be determined by the number or size of pull-down transistors included in the pull-down compensation path unit.

The path control unit may include a control unit configured to generate the control signal in response to the conditional signal and a selection unit configured to provide the input signal to one of the pull-up compensation path unit and the pull-down compensation path unit in response to the control signal.

The control unit may generate the control signal based on the conditional signal which includes the operation modes and an external power supply.

The conditional signal includes a plurality of test signals for performing one of a normal mode and a test mode, and the control unit may control the state of the control signals based on the state of the test signals.

The control unit may include a fuse of which the external power supply is determined by the cutting state.

The selection unit may include a transfer gate configured to transfer the input signal in response to the control signal.

DESCRIPTION OF SPECIFIC EMBODIMENTS

Other objects and advantages of the present invention can be understood by the following description, and become apparent with reference to the embodiments of the present invention.

In order to adjust the skew change of rising and falling edges of a pulse signal, an integrated circuit of the present invention compensates for abnormal operations based on external environment and process variables by selecting one of pull-up and pull-down paths of an internal circuit such as a pulse generator, and controlling a signal to be passed through the selected path.

Figure 1:
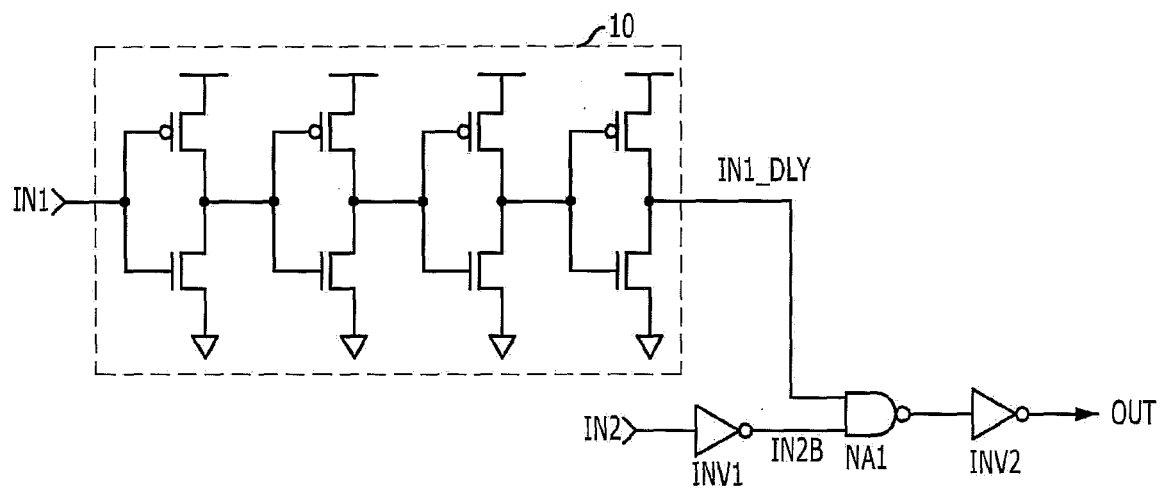
FIG. 1 is a circuit diagram illustrating a conventional pulse generator.
Figure 2:
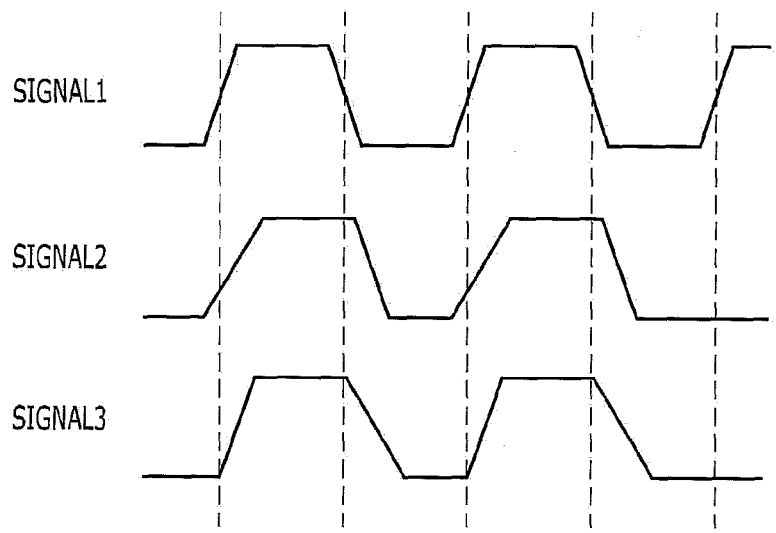
FIG. 2 is a waveform diagram illustrating abnormal pulse signals.
Figure 3:
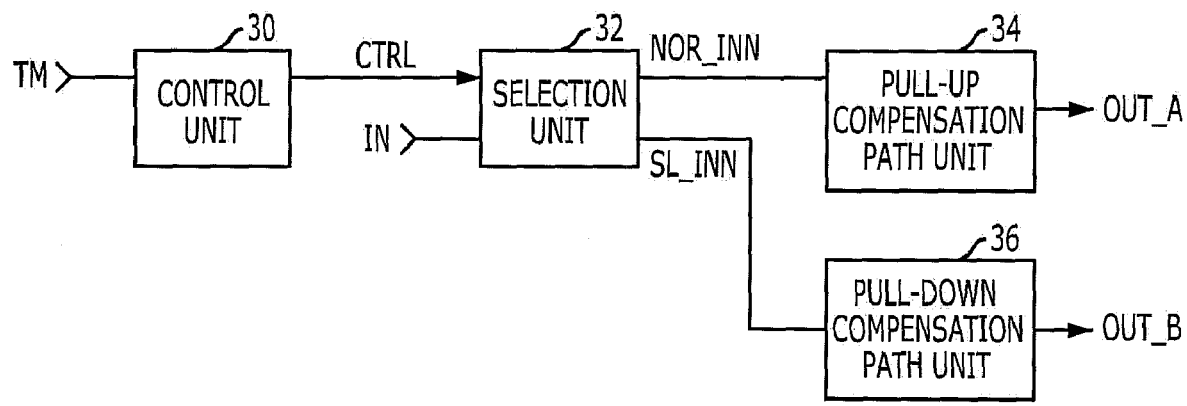
FIG. 3 is a block diagram illustrating an integrated circuit in accordance with a first embodiment of the present invention.

FIG. 3 is a block diagram illustrating an integrated circuit in accordance with a first embodiment of the present invention.

An integrated circuit shown in FIG. 3 includes a control unit 30, a selection unit 32, a pull-up compensation path unit 34 and a pull-down compensation path unit 36.

The control unit 30 generates a control signal CTRL in response to an operation mode TM and an external power supply.

The selection unit 32 selects one of the pull-up compensation path unit 34 and the pull-down compensation path unit 36 in response to the control signal CTRL and provides an input signal IN to a selected path.

That is, the control unit 30 enables and outputs the control signal CTRL when a predetermined power is supplied from an external. The control unit enables and outputs the control signal CTRL during a specific mode, e.g., a test mode, except a normal mode.

Herein, when a skew is large, the specific mode may be applied.

Figure 4:
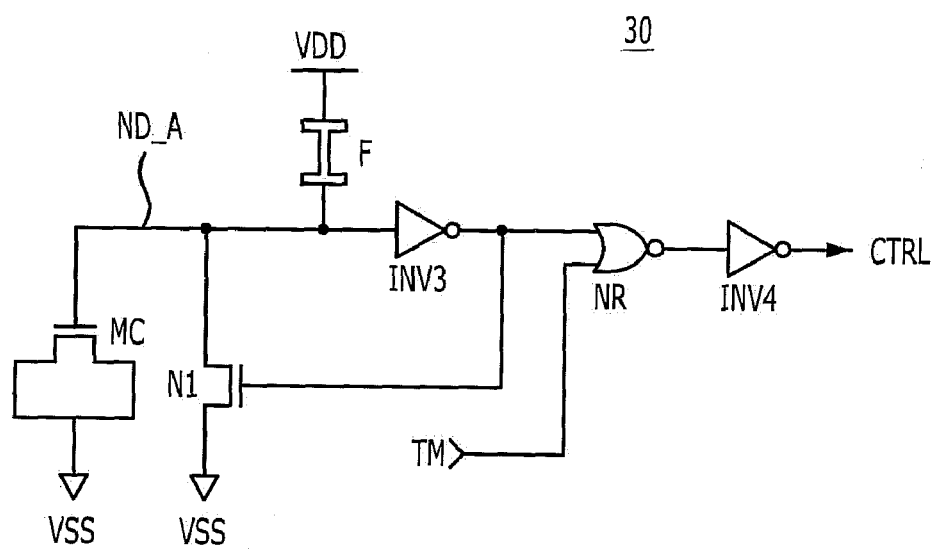
FIG. 4 is a circuit diagram illustrating a control unit shown in FIG. 3.

FIG. 4 is a circuit diagram illustrating a control unit shown in FIG. 3.

As shown in FIG. 4, the control unit 30 outputs the control signal CTRL which is determined by a state of the normal mode and the test mode and the cutting information of a fuse F for controlling an external power supply VDD.

The control unit 30 includes a fuse F, a MOS capacitor MC, a pull-down transistor N1, a first inverter INV3, a NOR gate NR and a second inverter INV4.

The fuse F is coupled between a node ND_A and an external power VDD. The MOS capacitor MC is coupled between the node ND_A and a ground VSS. The pull-down transistor N1 is coupled between the node ND_A and the ground VSS, and a gate of the pull-down transistor N1 is coupled to an output node of the first inverter INV3. The NOR gate NR performs a logic NOR operation of a test signal TM and an output signal of the NOR gate. The second inverter INV4 inverts an output of the NOR gate NR and outputs the control signal CTRL. The test signal TM is disabled during the normal mode and is enabled during the test mode.

Operations of the control unit 30 shown in FIG. 4 will be described below in details. When the external power VDD is supplied, that is, the fuse F is not cut, the node ND_A is a logic high level and the enable state of the control signal CTRL is determined by the state of the test signal TM. Herein, the MOS capacitor MC is charged by the external power VDD.

When the external power VDD is not supplied, that is, the fuse F is cut, the power charged in the MOS capacitor MC is discharged and after a predetermined time, the node ND_A is maintained at a logic low level by a latch operation of the pull-down transistor N1 and the first inverter INV3.

Meanwhile, during the test mode, that is, the test signal TM is enabled, the control signal CTRL is maintained at the enabled state irrespective of the cutting state of the fuse F.

Figure 5:
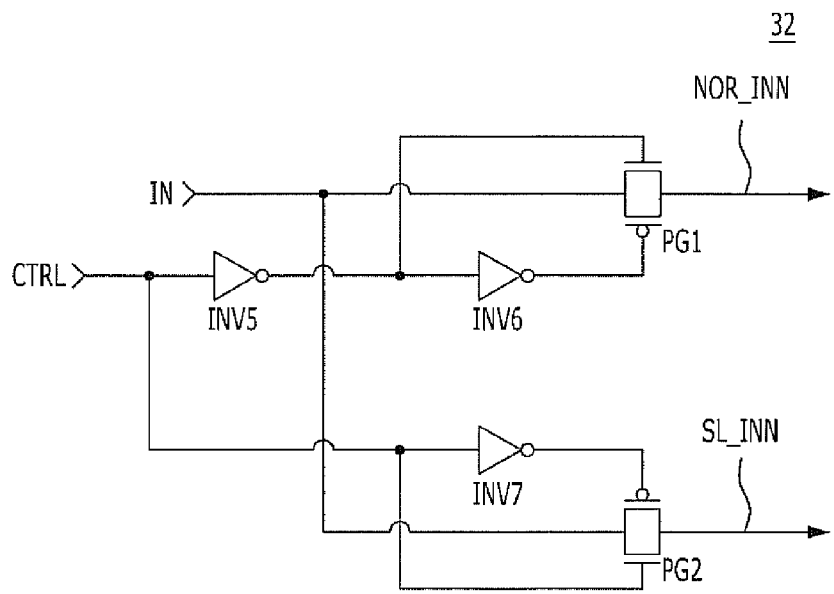
FIG. 5 is a circuit diagram illustrating the selection unit shown in FIG. 3.

FIG. 5 is a circuit diagram illustrating the selection unit shown in FIG. 3.

As shown in FIGS. 3 and 5, the selection unit 32 transfers an input signal IN to the pull-up compensation path unit 34 when the control signal CTRL is disabled, and transfers the input signal IN to the pull-down compensation path unit 36 when the control signal CTRL is enabled.

The selection unit 32 includes a third inverter INV5, a fourth inverter INV6, a first transfer gate PG1, a fifth inverter INV7 and a second transfer gate PG2.

The third inverter INV5 inverts the control signal CTRL. The fourth inverter INV6 inverts an output of the third inverter INV5. The first transfer gate PG1 receives the input signal IN, the output of the third inverter INV5 and an output of the fourth inverter INV6, and transfers the input signal IN to an input node NOR_INN of the pull-up compensation path unit 34 in response to the outputs of the third and fourth inverters INV5 and INV6. The fifth inverter INV7 inverts the control signal CTRL. The second transfer gate PG2 receives the input signal IN, the control signal CTRL and the output signal of the fifth inverter INV7, and transfers the input signal IN to an input node SL_INN of the pull-down compensation path unit 36 in response to the control signal CTRL and the output of the fifth inverter INV7.

When the input signal IN is transferred to the input node NOR_INN of the pull-up compensation path unit 34 through the selection unit 32, the pull-up compensation path unit 34 adjusts a pull-up driving power of the input signal IN and outputs an output signal OUT_A.

When the input signal IN is transferred to the input node SL_INN of the pull-down compensation path unit 36 through the selection unit 32, the pull-down compensation path unit 36 adjusts a pull-down driving power of the input signal IN and outputs an output signal OUT_B.

Various methods for adjusting the pull-up driving power and the pull-down driving power may be implemented. For example, a pull-up driving power may be adjusted by adjusting the size of a pull-up PMOS transistor of each of inverters included in a delay unit of a pulse generator. A pull-down driving power may be adjusted by adjusting the size of a pull-down NMOS transistor of each of inverters included in a delay unit. Accordingly various configurations of the pull-up compensation path unit 34 and the pull-down compensation path unit 36 may be implemented. For example, the pull-up compensation path unit 34 may include a switch (e.g., a PMOS transistor) coupled between a high voltage supply and an output terminal for outputting the output signal OUT_A. In this case, when the switch is closed, the high voltage supply drives the output signal OUT_A to a high logic level. Similarly, for example, the pull-down compensation path unit 36 may include a switch (e.g., an NMOS transistor) coupled between a low voltage supply and an output terminal for outputting the output signal OUT_B. In this case, when the switch is closed, the low voltage supply drives the output signal OUT_B to a low logic level.

Figure 6:
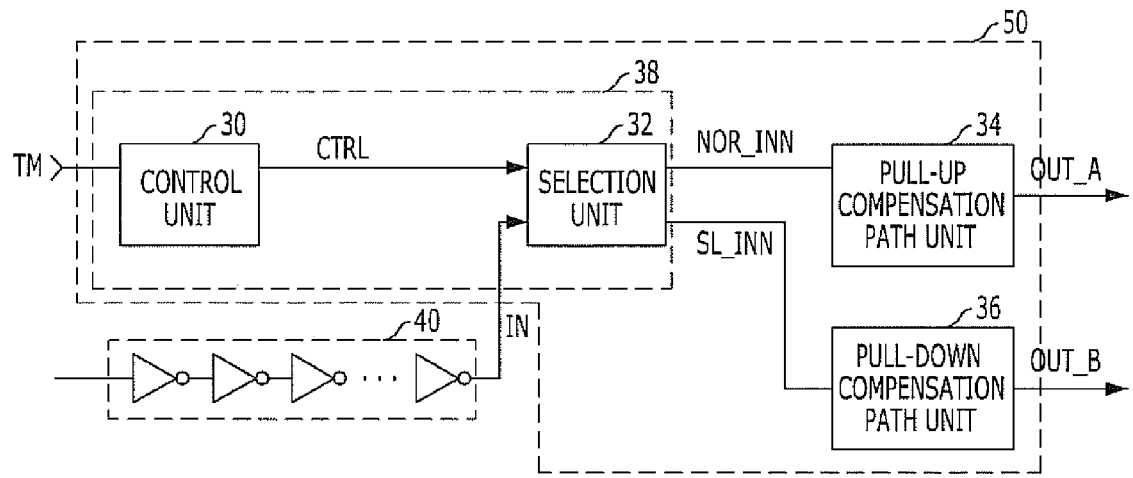
FIG. 6 is a block diagram illustrating an integrated circuit in accordance with a second embodiment of the present application.

FIG. 6 is a block diagram illustrating an integrated circuit in accordance with a second embodiment of the present application. Referring to FIG. 6, in accordance with a second embodiment of the present invention, an integrated circuit includes a pulse generation circuit unit 40 and a driving power compensation unit 50. The pulse generation circuit unit 40 has an inverter chain. The driving power compensation unit 50 includes a pull-up compensation path unit 34, a pull-down compensation path unit 36, and a path control unit 38.

The driving power compensation unit 50 selectively compensates for one of a pull-up driving power and a pull-down driving power of each of inverters included in the inverter chain. The pull-up compensation path unit 34 adjusts the pull-up driving power of an input signal IN. The pull-down compensation path unit 36 adjusts the pull-down driving power of the input signal IN. The path control unit 38 includes a control unit 30 and a selection unit 32, and routes the input signal IN to one of the pull-up compensation path unit and the pull-down compensation path unit based on the external power supply and the operation modes.

Detailed description and operation of the integrated circuit in accordance with the second embodiment of the present invention are omitted because the configuration of the integrated circuit in accordance with the second embodiment of the present invention is similar to the configuration of the integrated circuit shown in FIG. 3 in accordance with the first embodiment of the present invention.

Figure 7:
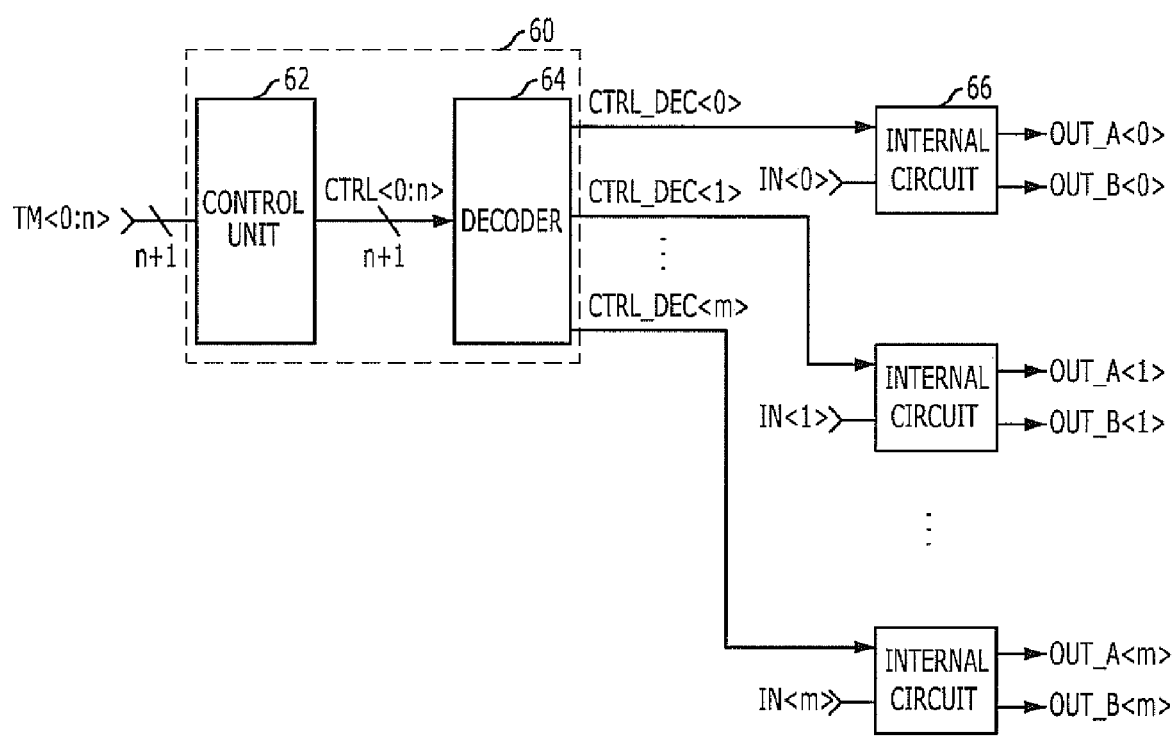
FIG. 7 is a circuit diagram illustrating an integrated circuit in accordance with a third embodiment of the present invention.

FIG. 7 is a circuit diagram illustrating an integrated circuit in accordance with a third embodiment of the present invention.

As shown in FIG. 7, the integrated circuit includes a path control unit 60 and a plurality of internal circuits 66.

The path control unit 60 outputs path control signals CTRL_DEC<0:m> for selecting a path based on external power supply and operation modes, and includes a control unit 62 and a decoder 64, where m is a natural number larger than n.

The control unit 62 outputs control signals CTRL<0:n> for selecting a path based on external power supply and operation modes, where n is a natural number.

The control unit 62 may have identical circuit configuration to the circuit configuration of the control unit 30 shown in FIG. 4. The state of a plurality of control signals CTRL<0:n> is determined by the fuse and the test signals TM<0:n>.

The decoder 64 decodes the control signals CTRL<0:n> and outputs the plurality of path control signals CTRL_DEC<0:m>.

Each of the plurality of internal circuits 66 includes a pull-up compensation path and a pull-down compensation path. One of the pull-up compensation path and the pull-down compensation path is selected in response to each of the path control signals CTRL_DEC<0:m>. The plurality of internal circuits 66 receive the input signals IN<0:m> and outputs output signals OUT_A<0:m> or OUT_B<0:m> through a selected path, respectively.

Herein, each of the internal circuits 66 includes a selection unit, a pull-up compensation path unit and a pull-down compensation path unit, which are corresponding to the selection unit 32, the pull-up compensation path unit 34 and the pull-down compensation path unit 36 shown in FIG. 3.

The integrated circuits in accordance with embodiments of the present invention may effectively compensate for a rising edge skew and a falling edge skew of a pulse signal to be generated by performing an input signal through one of a pull-up compensation path and a pull-down compensation path when process and external environments are greatly varied.

Moreover, the integrated circuits in accordance with embodiments of the present invention may generate a normal pulse signal without an additional correction even if the variation of the process and external environments is not predicted.

Furthermore, the integrated circuits in accordance with embodiments of the present invention may compensate for a skew of a pulse signal generated in a plurality of circuits by selecting and controlling a pull-up compensation path and a pull-down compensation path of a plurality of internal circuits with a decoding.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
   a pull-up compensation path unit comprising a transistor receiving an input signal at its gate, and configured to adjust a pull-up driving power of the input signal to compensate for an abnormal pull-up operation;
   a pull-down compensation path unit comprising a transistor receiving the input signal at its gate, and configured to adjust a pull-down driving power of the input signal to compensate for an abnormal pull-down operation; and
   a path control unit configured to route the input signal to one of the pull-up compensation path unit and the pull-down compensation path unit,
   wherein the path control unit includes:
      a control unit configured to generate a control signal in response to an operation mode signal and a supply voltage; and
      a selection unit configured to provide the input signal to one of the pull-up compensation path unit and the pull-down compensation path unit in response to the control signal.

2. The integrated circuit of claim 1, wherein the pull-up compensation path unit is configured to adjust a rising edge skew of an output pulse, and the pull-down compensation path unit is configured to adjust a falling edge skew of the output pulse.

3. The integrated circuit of claim 1, wherein the pull-up driving power is determined by the number or size of pull-up transistors included in the pull-up compensation path unit.

4. The integrated circuit of claim 1, wherein the pull-down driving power is determined by the number or size of pull-down transistors included in the pull-down compensation path unit.

5. The integrated circuit of claim 1, wherein the control unit includes:
   a MOS capacitor coupled between a node and a ground terminal;
   a pull-down transistor coupled between the node and a ground terminal; and
   a fuse coupled between the node and an external power supply.

6. The integrated circuit of claim 1, wherein the control unit performs a NOR operation on the operation mode signal and the supply voltage to generate the control signal.

7. The integrated circuit of claim 1, wherein the operation mode signal includes a test signal for performing one of a normal mode and a test mode, and the control unit is configured to control the state of the control signal based on the state of the test signal.

8. The integrated circuit of claim 1, wherein the supply voltage is provided by an external power supply when a fuse is not cut, and the supply voltage is maintained at a logic low level when the fuse is cut.

9. The integrated circuit of claim 1, wherein the selection unit includes a transfer gate for transferring the input signal in response to the control signal.

10. An integrated circuit, comprising:
    a path control unit configured to generate a plurality of path control signals; and
    a plurality of internal circuits, each configured to have a pull-up compensation path and a pull-down compensation path and to process a corresponding input signal through one of the pull-up compensation path and the pull-down compensation path in response to a corresponding path control signal, wherein each of the pull-up compensation path and the pull-down compensation path comprises a transistor receiving the input signal at its gate, and
    wherein the path control unit includes:
       a control unit configured to generate a plurality of control signals in response to operation modes and a supply voltage, which depends on a state of a fuse;
       a decoder configured to decode the plurality of control signals and to output the decoded control signals as the path control signals.

11. The integrated circuit of claim 10, wherein the control unit includes:
    a MOS capacitor coupled between a node and a ground terminal;
    a pull-down transistor coupled between the node and a ground terminal; and
    the fuse coupled between the node and an external power supply.

12. The integrated circuit of claim 10, wherein the control unit includes the fuse for controlling an external power supply, and controls the state of the control signals based on the cutting state of the fuse.

13. The integrated circuit of claim 10, wherein the control unit is configured to receive a plurality of test signals for performing one of a normal mode and a test mode and to control the state of the control signals based on the state of the test signals.

14. The integrated circuit of claim 10, wherein each of the internal circuits includes:
    a pull-up compensation path unit for adjusting a pull-up driving power of the corresponding input signal;
    a pull-down compensation path unit for adjusting a pull-down driving power of the corresponding input signal; and a selection unit for selecting one of the pull-up compensation path unit and the pull-down compensation path unit in response to the corresponding path control signal, and for providing the corresponding input signal to a selected path.

15. The integrated circuit of claim 14, wherein the pull-up compensation path unit is configured to adjust a rising edge skew of an output pulse, and the pull-down compensation path unit is configured to adjust a falling edge skew of the output pulse.

16. The integrated circuit of claim 14, wherein the pull-up driving power is determined by the number or size of pull-up transistors included in the pull-up compensation path unit.

17. The integrated circuit of claim 14, wherein the pull-down driving power is determined by the number or size of pull-down transistors included in the pull-down compensation path unit.

18. The integrated circuit of claim 14, wherein the selection unit includes a transfer gate for transferring the input signal in response to the corresponding path control signal.

19. An integrated circuit, comprising:
   a pulse generation circuit unit configured to have an inverter chain; and
   a driving power compensation unit configured to selectively compensate for one of a pull-up driving power and a pull-down driving power of an output signal of the pulse generation circuit unit,
   wherein the driving power compensation unit includes:
      a pull-up compensation path unit comprising a transistor receiving an input signal at its gate, and configured to adjust the pull-up driving power of the input signal;
      a pull-down compensation path unit comprising a transistor receiving the input signal at its gate, and configured to adjust the pull-down driving power of the input signal; and
      a path control unit configured to route the input signal to one of the pull-up compensation path unit and the pull-down compensation path unit,
   wherein the path control unit includes:
      a control unit configured to generate a control signal in response to an operation mode signal and a supply voltage, which depends on a state of a fuse; and
      a selection unit configured to provide the input signal to one of the pull-up compensation path unit and the pull-down compensation path unit in response to the control signal.

20. The integrated circuit of claim 19, wherein the pull-up driving power is determined by the number or size of pull-up transistors included in the pull-up compensation path unit.

21. The integrated circuit of claim 19, wherein the pull-down driving power is determined by the number or size of pull-down transistors included in the pull-down compensation path unit.

22. The integrated circuit of claim 19, wherein the path-control unit includes:
   a MOS capacitor coupled between a node and a ground terminal;
   a pull-down transistor coupled between the node and a ground terminal; and
   the fuse coupled between the node and an external power supply.

23. The integrated circuit of claim 19, wherein the control unit performs a NOR operation on the operation mode signal and the supply voltage to generate the control signal.

24. The integrated circuit of claim 19, wherein the operation mode signal includes a test signal for performing one of a normal mode and a test mode, and the control unit is configured to control the state of the control signal based on the state of the test signal.

25. The integrated circuit of claim 19, wherein the supply voltage is provided by an external power supply when the fuse is not cut, and the supply voltage is maintained at a logic low level when the fuse is cut.

26. The integrated circuit of claim 19, wherein the selection unit includes a transfer gate configured to transfer the input signal in response to the control signal.

* * * * *